April 2, 1963 A. L. HARRINGTON 3,084,079

MANUFACTURE OF SEMICONDUCTOR DEVICES

Filed Oct. 13, 1960

ALAN L. HARRINGTON,
INVENTOR.

BY HIS ATTORNEYS

Spensley & Horn

United States Patent Office 3,084,079

Patented Apr. 2, 1963

3,084,079

MANUFACTURE OF SEMICONDUCTOR DEVICES

Alan L. Harrington, Los Angeles, Calif., assignor to Pacific Semiconductors, Inc., Culver City, Calif., a corporation of Delaware Filed Oct. 13, 1960, Ser. No. 62,495
5 Claims. (Cl. 148—1.5)

This invention relates to the manufacture of semiconductor devices and more particularly to an improved method for producing diffused junction semiconductor devices.

In the semiconductor art, a region of semiconductor material containing an excess of donor impurities and having an excess of free electrons is considered to be an N type region, while a P type region is one containing an excess of acceptor impurities resulting in a deficit of electrons, or stated differently, an excess of holes. When a continuous solid specimen of crystal semiconductor material has an N type region adjacent a P type region, the boundary between them is termed a P-N (or N-P) junction and the specimen of semiconductor material is termed a P-N junction semiconductor device. A specimen having two N type regions separated by a P type region, for example, is termed an N-P-N junction semiconductor device, or transistor, while a specimen having two P type regions separated by an N type region is termed a P-N-P semiconductor device or transistor.

These P-N or N-P junctions are hereafter referred to as rectifying junctions or simply as junctions. It is often desirable to provide a non-rectifying junction or ohmic contact to a semiconductor body. The method of the present invention is particularly adapted to the production of both rectifying and non-rectifying junctions by the phenomenon of diffusion of a nactive impurity atom, namely boron, into the semiconductor starting crystal.

When a P type starting crystal such as silicon, for example, of a given resistivity has acceptor impurities diffused therein, a diffused P type region of a different resistivity is produced. The gradation between these two regions is what is herein termed a non-rectifying junction and may be used for producing an ohmic contact. The term junction therefore, for the purpose of this invention, is intended to include both rectifying and non-rectifying junctions.

The term semiconductor material as utilized herein is considered generic to germanium, silicon, and germanium silicon-alloys and is employed to distinguish these semiconductors from metallic oxide semiconductors such as copper-oxide.

The term active impurity is used to denote those impurities which affect the electrical rectification characteristics of semiconductor materials as distinguished from other impurities which have no appreciable effect upon these characteristics.

Active impurities are ordinarily classified as donor impurities such as phosphorus, arsenic and antimony or acceptor impurities such as boron, gallium, aluminum and indium.

This invention is particularly directed at an improved diffusion technique. Prior art diffusion techniques may be classified as either open-tube or closed-tube processes. The open-tube process usually involves vapor-solid diffusion of the desired impurity in a furnace in which certain gases are introduced to control the ambient therein. Such a process is described in U.S. Patent No. 2,802,760 entitled "Oxidation of Semiconductive Surfaces for Controlled Diffusion," by Derrick and Frosch, issued August 13, 1957.

The closed-tube process, on the other hand, as the name suggests, involves the carrying out of the diffusion in a sealed container, ordinarily in a non-oxidizing atmosphere. One such process is described in U.S. Patent No. 2,827,-403 entitled "Method for Diffusing Active Impurities into Semiconductive Materials," by T. C. Hall and C. A. Levi, issued March 18, 1958.

The present invention method may loosely be considered as an open-tube process, although unlike the prior art open-tube process, no attempt is made to control the atmosphere within the furnace. That is, it is exposed to the ambient, hence, it is a far more simple process thus making it considerably less expensive to practice. The present invention diffusion process, unlike the prior art open or closed tube methods, may be performed without elaborate equipment, without the employment of carrier gases and without the usual separation of the wafers which is ordinarily provided within the furnace during the diffusion run.

Another prior art process involves the use of a glass-like slurry containing pulverized particles which includes a nactive impurity such as aluminum oxide. This slurry is deposited over the surface of the semiconductor body into which diffusion is to take place. Such a process is described and claimed in U.S. Patent No. 2,794,846, entitled "Fabrication of Semiconductor Devices," by C. S. Fuller, issued June 4, 1957.

The main disadvantage of the open-tube process is the relative complexity in preparation of the wafer prior to the diffusion process. Further, the wafers must be separated to allow the source to come in contact with the surface into which diffusion is desired to take place. Additionally, separation of the wafers during the closed-tube diffusion run is required to eliminate permanent fusion of one wafer with the adjacent wafer. Carrying gases are needed or a vacuum system need be employed in order to seal off the wafers. Finally, employment of a glass slurry is difficult because of the non-homogeneity of the residual glass after drying.

The present invention method overcomes all of the disadvantages of the hereinabove described prior processes while presenting a simple, reliable and inexpensive novel diffusion process.

In accordance with the presently preferred embodiment of this invention a liquid organic polymer, namely trimethoxyboroxine mixed with methyl trimethoxy silane containing a homogeneous active impurity source, namely boron, is painted or otherwise deposited upon the wafer or wafers to be diffused. The wafers are then stacked face to face so that those faces upon which the polymer has been deposited are in contact with one another. The wafers are then placed into a furnace which is heated to the diffusion temperature for a time sufficient to cause diffusion to the desired depth. It has been found preferable although not necessary to first heat the coated wafers to a temperature of from 50° C. to 200° C. for approximately five minutes in order to air cure the homogeneous organic liquid polymer upon the surface of the crystal prior to subjecting it to the diffusion run.

It is therefore an object of the present invention to provide a new and improved diffusion technique for producing a junction within a semiconductor crystal body.

Yet another object of the present invention is to provide an improved diffusion technique for diffusing boron into a semiconductor crystal body without the requirement of controlling the ambient conditions.

Yet a further object of the present invention is to provide an improved technique for diffusing boron into a silicon crystal in order to provide a junction therein which is relatively inexpensive and which is highly reliable and reproducible.

Still a further object of the present invention is to provide an improved boron diffusion technique to produce a junction in a silicon crystal body which greatly minimizes pitting of the silicon surface during the diffusion run.

The novel features which are believed to be characteristic of the present invention, together with further objects and advantages thereof, will be better understood from the following description in which the invention is illustrated by way of example. It is to be expressly understood, however, that the description is for the purpose of illustration only and that the true spirit and scope of the invention is defined by the accompanying claims.

Figure 3:
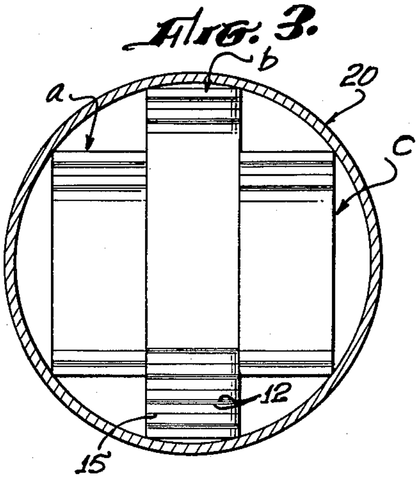
FIGURE 3 shows a stack of wafers as in FIGURE 2, greatly enlarged in scale with respect to the diameter of the furnace, during the diffusion run.
Figure 5:
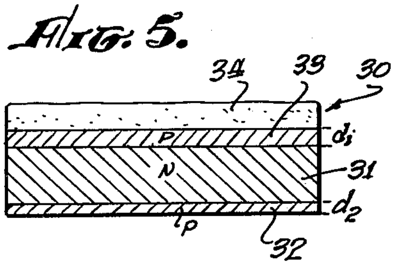
Figure 4:
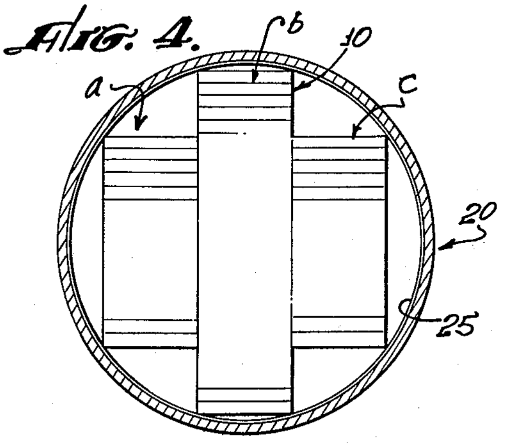

FIGURE 4 corresponds in scale to FIGURE 3 and shows a stack of wafers within a furnace being treated in accordance with an alternate method of the present invention;

FIGURE 5 shows a single wafer during subsequent stages of production; and

Figure 6:
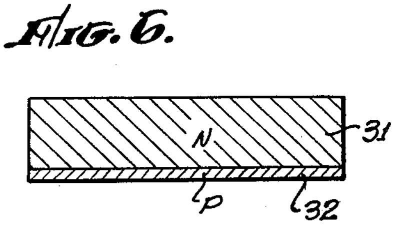

FIGURE 6 shows the wafer of FIGURE 5 at a stage of production subsequent to FIGURE 5.

Figure 1:
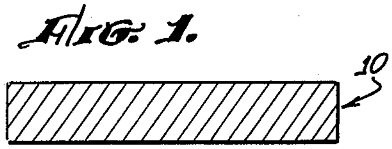
FIGURE 1 is a cross-sectional view of a silicon wafer to be treated in accordance with the present invention method.

Referring now to the drawing, there is shown in FIGURE 1 a cross-sectional view of a semiconductor crystal 10 which may either be N or P type conductivity and may be germanium, silicon or germanium-silicon alloy. For the purpose of clarity and simplicity of explanation it will hereafter be assumed that the semiconductor starting crystal 10 is of N type conductivity silicon unless otherwise indicated.

Figure 2:
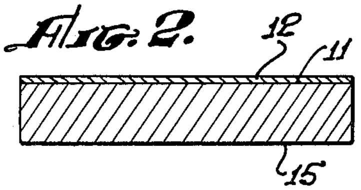
FIGURE 2 shows the wafer of FIGURE 1 during an early stage of production in accordance with the present invention method.

According to the preferred embodiment of the method of the present invention, silicon crystal 10 has deposited over the upper surface 11 thereof, a coating 12 of a liquid polymer containing a homogeneous mixture of two organic materials, as shown in FIGURE 2. These materials are trimethoxyboroxine whose formula is $(MeO)_3B \cdot B_2O_3)$ and methyl trimethoxy silane whose formula is $MeSi(OMe)_3$. The presently preferred embodiment of this invention calls for a mixture of 50% of each of such materials by volume. The liquid polymer consisting of these two solutions can be painted, dipped or sprayed over the surface 11. Any method by which it is so deposited can be used. A plurality of such coated wafers are then stacked so that their surfaces 11 face one another with the coated surfaces being face to face as is shown in FIGURE 3. Several of these stacks indicated as *a*, *b* and *c* are placed within an open tube quartz container 20. As noted above, the scale of the wafers is greatly enlarged relative to the diameter of the container for purposes of illustration. In practice many more stacks would be contained within the volume of the container 20. Prior to stacking the wafers face to face, contact as was indicated above, the wafers may preferably be heated for approximately 5 minutes to a temperature in a range from 50° C. to 200° C. with the surface which has been coated being exposed to air. This preliminary step, while not necessary, has been found to be desirable in order to increase the uniformity of deposition of the coating prior to the diffusion run. It further serves to render the coating relatively solid and therefore uniform. This is especially important where the coating is applied by dipping, as opposed to painting or spraying, whereby a relatively thin coating is established. This preheating step causes the coating to assume a glazelike appearance. Next the wafers are stacked face to face as is shown in FIGURE 3, within container 20. They are then heated to a temperature of approximately 1380° C. for from 8 to 16 hours to thus diffuse boron from the liquid polymer solution primarily into the surface 11 of the silicon wafer 10 to thus produce a P–N junction. A diffusion run at a temperature of 1380° C. will produce a depth of diffusion of approximately 4 mils if maintained at that temperature for approximately 16 hours. That is, the depth into the surface coated 11 is approximately 4 mils under these conditions. Significant diffusion also takes place into the surface 15 opposite that which is coated. In fact, in the example under consideration, the depth has been observed to be 3 mils. This diffused region in the opposite side 15 has for some purposes been found to be the one preferably chosen as the active region while the diffused region underlying the coating 12 is lapped off.

While in the above example the diffusion temperature has been specifically designated under particular condition to yield a specific depth of diffusion it will be understood by those skilled in the art that this is by way of example only. Actually the diffusion temperature may be varied over a considerable range. The only limitation on the upper end of the range is the melting of the semiconductor material, e.g. 1420° C. for silicon for example. The temperature and time both determine the depth of diffusion. A diffusion run at a higher temperature will require a shorter period of time in order to result in a given depth. Contrariwise a lower temperature and a longer period of time will result in the same junction depth. The previously mentioned temperature (1380° C.) is employed for maximum junction depth in the least amount of time. Actually no definite lower limit can be designated as same diffusion will occur at any temperature above at least 600° C. to produce a diffusion to any appreciable depth within a reasonable period of time. If desired where a very shallow diffusion is required even lower temperatures may be used.

Thus, the present invention involves the use of two compounds to produce a single polymer of different properties from the original liquid to produce a very high melting point solid. This is particularly important as the present invention single polymer liquid source has a low temperature cure and a low temperature of application. In fact, it can be applied at room temperature as was indicated hereinabove. Further, the concentration of the active impurity, namely boron, can be varied by varying the amount of the methyltrimethoxy-silane which is added basically as a solvent for the trimethoxyboroxine; that is, the percentage of each of the constituents may be varied over a very wide range of from 0 to 99 percent by volume of the boron compound to the solvent.

In FIGURES 5 and 6 this approach is illustrated. Therein the coating 34 is applied to the upper surface of crystal 30. During the diffusion heating cycle at the temperature and for the time above mentioned, for example, diffusion of boron will take place into regions 32 and 33 such that the depth of diffusion $d_1$ within N-type region 31 will be approximately 4 mils and the depth $d_2$ will be approximately 3 mils. Thereafter the coating and region 33 is removed by lapping to result in the P-N junction-device of FIGURE 6. Such a procedure has been found to be especially important where it is preferred to keep the surface concentration of the boron below a normal level. That is, the concentration is less on the surface opposite the coating 34 than that therebelow.

In fact, it has been found possible to entirely eliminate the solvent material, that is, the methyltrimethoxysilane, and still produce satisfactory diffusion by directly applying the trimethoxyboroxine alone. Further, the particular system has been found to be peculiarly compatible with silicon as the silane from the methyltrimethoxysilane provides a source of silicon atoms. $B_2O_3$ (which is evolved during the diffusion run) tends to dissolve silicon to produce oxides of silicon. Thus, if the only source of silicon is the wafer, pitting may result. By providing an independent source of silicon the system is self-satisfied as it has a source of silicon atoms from the silane.

The molecular presentation of the chemical reactions leading to diffusion can be shown as follows wherein the first monomer, namely trimethoxyboroxine is designated as A:

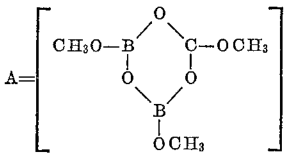

The presence of water causes hydrolysis to form a short lived intermediate reaction product:

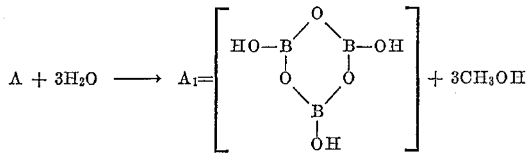

The second monomer, methyltrimethoxy silane, designated B also hydrolizes as follows:

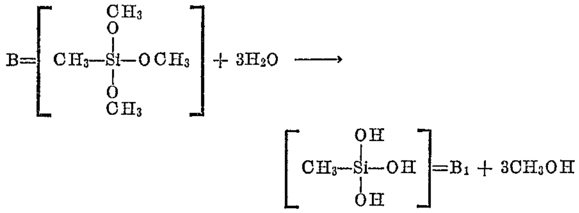

The intermediate reaction products $A_1$ and $B_1$ when mixed begin to polymerize by co-condensation as follows to form the final polymer designated AB

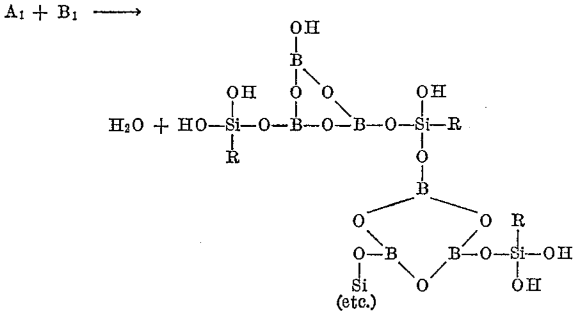

An alternate procedure for carrying out the present invention method is shown in FIGURE 4 wherein a plurality of wafers such as wafer 10 are stacked in 3 separate stackes indicated as *a*, *b* and *c*. In this instance the wafers are not previously coated with the active impurity organic polymer liquid, instead the liquid containing the active impurity source has previously been painted about the inner wall at 25 of the quartz tube 20. The entire furnace is then heated to the diffusion temperature such as 1380° C. and there maintained for a time of, for example, between 8 and 16 hours in order to carry out the diffusion. By a vapor transfer technique the boron is released from the liquid polymer and diffuses into all surfaces of the crystals 10 placed within the container. It has been found that by this technique an even more uniform distribution of the active impurity into the surfaces of the wafers is achieved.

The diffusion herein discussed, of course, results from the release of the boron from the polymer upon oxidation thereof in the presence of heat. This may be considered as a thermal decomposition process.

It should be pointed out that what is believed to occur is that during the thermal decomposition the organic groups are oxidized. Upon complete oxidation what was the polymer becomes a fused on super-cooled glossy composition upon cooling, i.e., as the temperature returns to room temperature following the diffusion run.

Thus, there has been described a new and improved technique for treating a semiconductor crystal body to produce a junction therein. Other analogous boroxine compounds may be substituted for the designated trimethoxyboroxine such as other alkyl and aryl boroxines so long as they are liquid at room temperature or slightly thereabove, i.e., liquid in their natural state or dissolved in a suitable solvent. It need further upon polymerization or thermal decomposition remain in the liquid or super cooled state.

What is claimed is:

1. The process of treating a semiconductor crystal body including the steps of:
   (1) applying a coating of a ploymerizable organoboron compound to said crystal body, said organoboron compound, when polymerized, being thermally decomposable;
   (2) polymerizing said coating; and
   (3) heating said body to a temperature and for a time sufficient to decompose said compound and to cause diffusion of boron into said body from said coating to thereby form a junction in said crystal body.

2. A process according to claim 1 wherein the organoboron compound is dissolved in a silane before it is applied to the crystal body.

3. A process in accordance with claim 1 wherein the organo-boron compound is an alkyloxyboroxine.

4. A process in accordance with claim 1 wherein the organo-boron compound is trimethoxyboroxine.

5. A process according to claim 4 wherein the trimethoxyboroxine is dissolved in methyltrimethoxysilane before it is applied to the crystal body.

References Cited in the file of this patent

UNITED STATES PATENTS

| | | |
|---|---|---|
| 2,484,519 | Martin | Oct. 11, 1949 |
| 2,794,846 | Fuller | June 4, 1957 |
| 2,802,760 | Derick et al. | Aug. 13, 1957 |
| 2,874,076 | Schwartz | Feb. 17, 1959 |
| 2,910,394 | Scott et al. | Oct. 27, 1959 |
| 2,974,073 | Armstrong | Mar. 7, 1961 |

OTHER REFERENCES

Vapor Plating, Powell, Campbell, and Gouser, John Wiley and Sons Inc., New York, 1955, pages 106 and 111 relied on.